("12") United States Patent  (10) Patent No.: US 7,835,477 B2
Suzuki                                (45) Date of Patent:     Nov. 16, 2010

(54) NOISE CANCELLER AND AM RECEIVING APPARATUS USING THE SAME

(75) Inventor: Jun Suzuki, Kumagaya (JP)

(73) Assignee: Sanyo Electric Co., Ltd., Osaka (JP)

( * ) Notice: Subject to any disclaimer, the term of this patent is extended or adjusted under 35 U.S.C. 154(b) by 869 days.

(21) Appl. No.: 11/734,760

(22) Filed: Apr. 12, 2007

(65) Prior Publication Data

US 2008/0013647 A1    Jan. 17, 2008

(30) Foreign Application Priority Data

Apr. 13, 2006    (JP) .............................. 2006-110878

(51) Int. Cl.
  H03D 3/22    (2006.01)
  H04B 1/10    (2006.01)
(52) U.S. Cl. ...................... 375/346; 455/296
(58) Field of Classification Search ................ 375/316, 375/340, 346, 350, 351, 260, 285, 242, 254; 381/94.1, 94.8; 455/296, 308, 311; 702/127, 702/189, 190, 191
See application file for complete search history.

(56) References Cited

U.S. PATENT DOCUMENTS 4,370,522 A * 1/1983 Takeda et al. .................. 381/3
4,704,642 A * 11/1987 Namiki ........................ 360/64
5,303,415 A * 4/1994 Takayama et al. ........... 455/296
6,993,309 B2 * 1/2006 Tsujishita et al. ............ 455/296
2005/0143109 A1* 6/2005 Ohashi ........................ 455/501
2005/0153674 A1* 7/2005 Suganuma ................... 455/296

FOREIGN PATENT DOCUMENTS

JP    06-112853    4/1994

* cited by examiner

Primary Examiner—David C Payne
Assistant Examiner—Vineeta S Panwalkar
(74) Attorney, Agent, or Firm—SoCal IP Law Group LLP; Steven C. Sereboff; John E. Gunther

(57) ABSTRACT

A noise canceller that a receiving signal received by a receiving antenna is input to, the noise canceller removing a pulse noise superimposed on the receiving signal to output the signal, the noise canceller comprising: a pulse noise detecting unit that detects the pulse noise superimposed on the receiving signal; a reception level detecting unit that detects the level of the receiving signal; a level hold unit that is triggered by the detection of the pulse noise with the pulse noise detecting unit to hold the level of the receiving signal in a process on the preceding stage of the output; and a level hold period setting unit that sets the level hold period when the level is held in the level hold unit in accordance with the level of the receiving signal detected by the reception level detecting unit.

7 Claims, 8 Drawing Sheets

(b)

NOISE CANCELLER AND AM RECEIVING APPARATUS USING THE SAME

CROSS-REFERENCE TO RELATED APPLICATION

This application claims the benefit of priority to Japanese Patent Application No. 2006-110878, filed Apr. 13, 2006, of which full contents are incorporated herein by reference.

BACKGROUND OF THE INVENTION

1. Field of the Invention

The present invention relates to a noise canceller and an AM receiving apparatus using the same.

2. Description of the Related Art

If a pulse noise P is superimposed on a receiving signal S received by a receiving antenna (see FIG. 8(a)), the pulse noise P is detected from the receiving signal S; the detected pulse noise P is peak-held; and when the peak-held value becomes greater than a predetermined threshold, a control signal H is generated which holds the level of the receiving signal S during a predetermined level hold period T (see FIG. 8(b)). A noise canceller has been proposed which holds the level of the receiving signal S during the level hold period T based on the control signal H (see FIG. 8(c)) to remove the pulse noise P from the receiving signal S (e.g., Japanese Patent Application Laid-Open Publication No. 6-112853).

With regard to the pulse noise P that may be superimposed on the receiving signal S, the pulse width fluctuates in accordance with the level of the receiving signal S received by the receiving antenna. For example, if the level is increased in the receiving signal S received by the receiving antenna, a relative level difference is reduced between the pulse noise P and the receiving signal S, which results in a waveform with the pulse noise P buried in the receiving signal S, and therefore, the pulse width of the detected pulse noise P is shortened in this case. On the other hand, if the level is reduced in the receiving signal S received by the receiving antenna, the relative level difference is enlarged between the pulse noise P and the receiving signal S, which results in a waveform with the pulse noise P appearing prominently in the receiving signal S, and therefore, the pulse width of the detected pulse noise P is elongated in this case.

Although the above phenomenon may occur, the level hold period T for each pulse noise P is fixed in a conventional noise canceller regardless of the magnitude of the level (field intensity) of the receiving signal S. Therefore, the level hold period T does not follow the fluctuations of the pulse width, and the level hold period T may become too long or too short for the pulse width of the pulse noise P.

If the level hold period T is too long for the pulse width of the pulse noise P, although the pulse noise P can certainly be removed, the distortion rate of the waveform of the receiving signal S accordingly worsens, causing deterioration of sound quality at the time of reproduction. On the other hand, if the level hold period T is too short for the pulse width of the pulse noise P, this is contrary to the original purpose of providing the noise canceller, which is to remove the pulse noise P.

SUMMARY OF THE INVENTION

In order to solve the above problems, according to a major aspect of the present invention there is provided a noise canceller that a receiving signal received by a receiving antenna is input to, the noise canceller removing a pulse noise superimposed on the receiving signal to output the signal, the noise canceller comprising: a pulse noise detecting unit that detects the pulse noise superimposed on the receiving signal; a reception level detecting unit that detects the level of the receiving signal; a level hold unit that is triggered by the detection of the pulse noise with the pulse noise detecting unit to hold the level of the receiving signal in a process on the preceding stage of the output; and a level hold period setting unit that sets the level hold period when the level is held in the level hold unit in accordance with the level of the receiving signal detected by the reception level detecting unit.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

<<Overall Configuration of AM Receiving Apparatus>>

Figure 1:
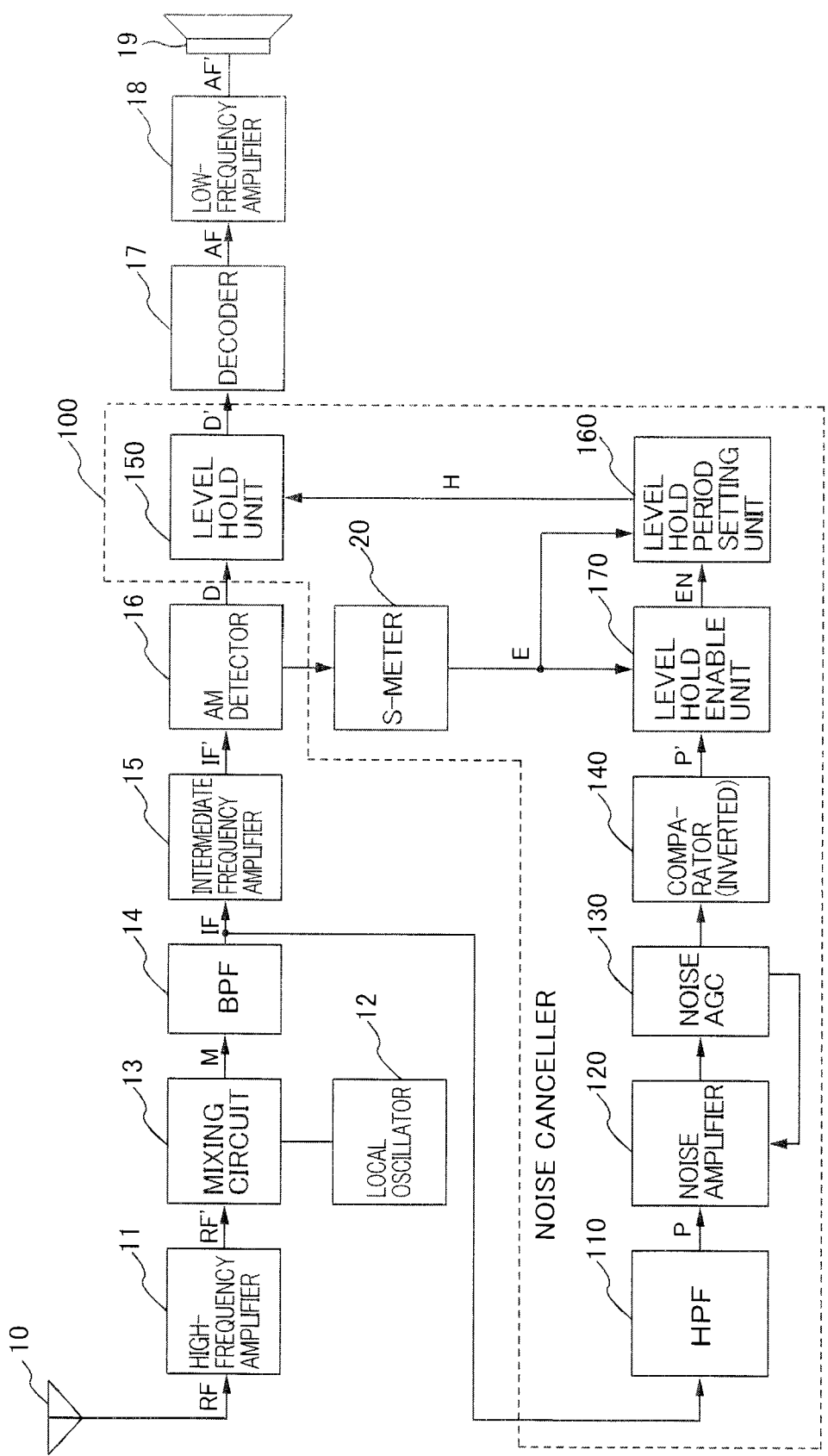
FIG. 1 is a diagram of an overall configuration of an AM receiving apparatus equipped with a noise canceller according to an embodiment of the present invention.

FIG. 1 is a diagram of an overall configuration of an AM receiving apparatus equipped with a noise canceller 100 according to an embodiment of the present invention. The AM receiving apparatus according to the present invention may be used as, for example, an in-car audio apparatus for automobiles, etc. Since AM modulation signals received by a receiving antenna 10 are in such an environment that the signals may be subject to the superimposition thereon of various pulse noises such as multipath noises, ignition noises, and other spontaneous white noises, etc., it is of great significance to dispose the noise canceller 100 for removing pulse noises.

==Configuration Other than Noise Canceller==

A configuration of the AM receiving apparatus other than the noise canceller 100 will be described with reference to FIG. 1.

The receiving antenna 10 is an antenna for receiving an AM modulation signal RF transmitted from an AM station.

A high-frequency amplifier 11 is an amplifier that selects an AM modulation signal (RF signal) having a reception frequency f1 (e.g., 1000 kHz) preset by a tuning circuit not shown among signals received by the receiving antenna 10 to output an RF' signal acquired by high-frequency amplification of the AM modulation signal.

A local oscillator 12, a mixing circuit 13, and a BPF (Band Pass Filter) 14 configure a frequency conversion circuit that converts the AM modulation signal received by the receiving antenna 10 into an IF signal (intermediate frequency signal).

The local oscillator 12 is an oscillator that generates an oscillation signal having an oscillation frequency f2 (e.g., 1455 kHz) different from the reception frequency f1.

The mixing circuit 13 is a circuit that mixes the RF' signal output from the high-frequency amplifier 11 and the oscillation signal from the local oscillator 12 to generate a mixed signal M having f2−f1 (e.g., 455 kHz) and f2+f1 (e.g., 2445 kHz) frequency components.

The BPF 14 extracts signal having either the (f2−f1) or (f2+f1) frequency component, i.e., the IF signal from the mixed signal M output from the mixing circuit 13.

An intermediate frequency amplifier 15 is a variable gain amplifier that outputs an IF' signal acquired by intermediate frequency amplification of the IF signal to the level that can be detected in the AM detection.

An AM detector 16 is a detector that outputs a detection signal D acquired in the AM detection by converting changes in the frequency of the IF' signal output from the intermediate frequency amplifier 15 into changes in oscillation.

A decoder 17 demodulates a sum (L+R) signal and a difference signal (L-R) signal from a detection signal D output from the AM detector 16 and then demodulates and outputs a left (L) signal and a right (R) signal. The left (L) signal and the right (R) signal are hereinafter referred to as an AF signal (low-frequency signal).

A low-frequency amplifier 18 is an amplifier that outputs an AF' signal acquired by low-frequency amplification of the AF signal output from the decoder 17. The AF' signal output from the low-frequency amplifier 18 is output as sound from a speaker 19 via a sound quality/sound volume adjustment circuit not shown.

An S-meter 20 is a meter that detects an electric field intensity E acquired by smoothing the level of the IF' signal to perform predetermined display for the detected electric field intensity E. Although the S-meter 20 may detect the electric field intensities of the IF signal and the detection signal D in addition to the IF' signal, the S-meter 20 must detect at least the electric field intensity of the signal on the stage before the noise canceller 100.

Although the S-meter 20 generally disposed on the AM receiving apparatus is diverted to a "reception level detecting unit" that detects a level of a receiving signal (e.g., IF' signal) in the noise canceller 100 according to the present invention, a sample hold circuit, etc., may otherwise be used.

==Configuration of Noise Canceller==

Figure 2:
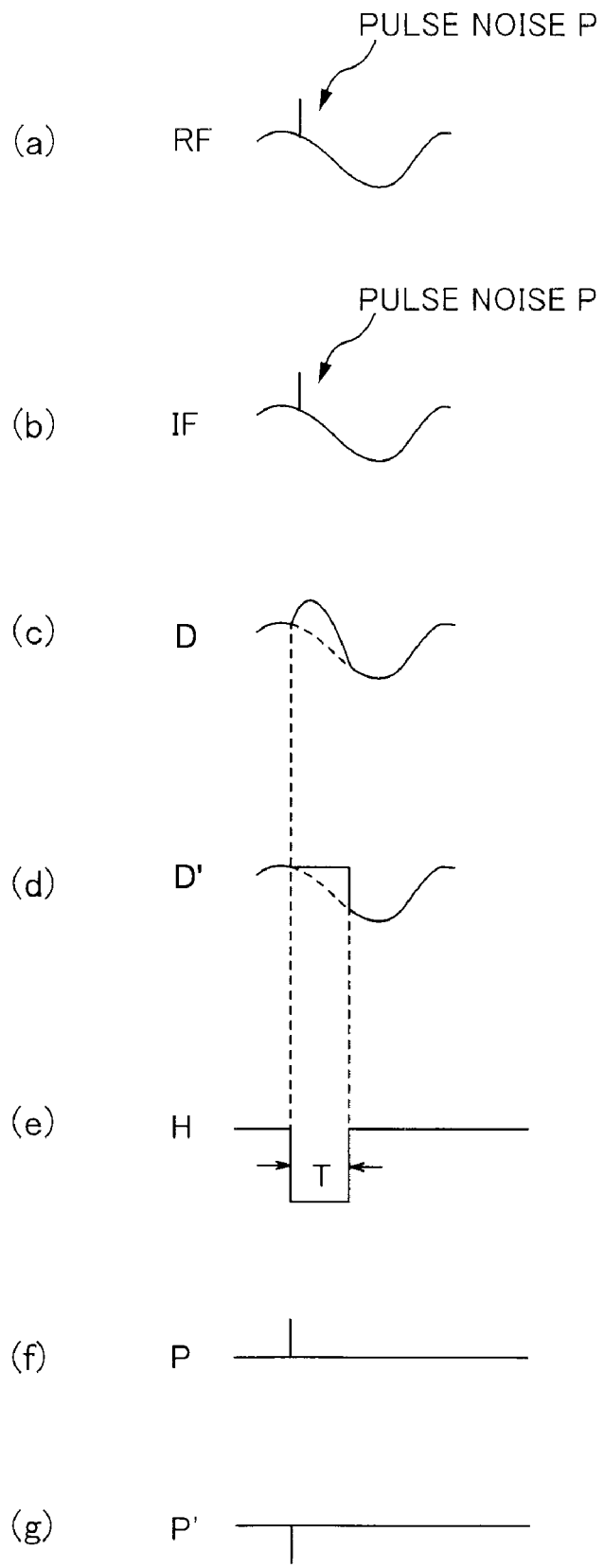
FIG. 2 is a main signal waveform diagram for explaining operation of the noise canceller according to an embodiment of the present invention.

The configuration of the noise canceller 100 in the AM receiving apparatus will be described with reference to FIG. 1 and FIG. 2. FIG. 2 is a main signal waveform diagram for explaining operation of the noise canceller 100.

The noise canceller 100 includes a level hold unit 150, an HPF (High Pass Filter) 110, a noise amplifier 120, a noise AGC (Automatic Gain Control) 130, a comparator 140, a level hold enable unit 170, a level hold period setting unit 160, and the S-meter 20. Although the noise canceller 100 has a hardware logic configuration for compensating the high-speed capability, a portion of the hardware logic may be realized by a DSP (Digital Signal Processor) with software.

The HPF 110, the noise amplifier 120, the noise AGC 130, and the comparator 140 configure a "pulse noise detecting unit" that detects a pulse noise P superimposed on the IF signal, according to the invention.

The HPF 110 is a high-pass filter that allows passage of a high band of the IF signal output from the BPF 14 to extract the pulse noise P (see FIG. 2(f)), focusing on the point that the pulse noise P that may be superimposed on the IF signal (see FIG. 2(b)) acquired by frequency-converting the RF signal (see FIG. 2(a)) received by the receiving antenna 10 has high-frequency components relative to the IF signal.

The noise amplifier 120 and the noise AGC 130 perform feedback amplification of the pulse noise P output from the HPF 110 to the level that allows appropriate processes on the subsequent stage.

The comparator 140 compares the pulse noise P output from the noise AGC 130 with a predetermined threshold and outputs H-level if the pulse noise P exceeds the threshold. This prevents the pulse noise P from being frequently detected regardless of the magnitude of the level.

The comparator 140 outputs a pulse noise P' (see, FIG. 2(g)) acquired by logically inverting the pulse noise P (see FIG. 2(f)) output from the noise AGC 130. That is, it is assumed that the pulse noise P' output from the comparator 140 indicates a pulse that becomes L-level in a noise generation section during the H-level.

The level hold unit 150 is triggered by the detection of the L-level pulse noise P' with the comparator 140 to output to the decoder 17 a detection signal D' (see FIG. 2(d)) acquired by holding the level of the detection signal D (see FIG. 2(c)) output from the AM detector 16. Although the level hold unit 150 may hold the level of the IF' signal or IF signal before AM detection in addition to holding the level of the detection signal D, this must be performed as a process of the stage before the final sound output from the speaker 19 on the stage subsequent to the detection of the electric field intensity E of the receiving signal and the detection of the pulse noise P.

The level hold period setting unit 160 outputs a period setting signal H (see FIG. 2(e)) for setting a level hold period T of holding the level of the detection signal D in the level hold unit 150 in accordance with the electric field intensity of the IF' signal detected by the S-meter 20. In the embodiment, it is assumed that the period setting signal H indicates L-level in the level hold period T during the H-level.

The level hold enable unit 170 performs control to enable the holding of the level of the detection signal D in the level hold unit 150 if the electric field intensity E of the IF' signal detected by the S-meter 20 does not exceed a predetermined reference level Vb and to disable the holding of the level of the detection signal D in the level hold unit 150 if the electric field intensity E exceeds the reference level Vb.

As a result, if the level of the receiving signal is increased more than necessary, a relative level difference is reduced between the receiving signal and the pulse noise P, which results in a waveform with the pulse noise P buried in the receiving signal, and therefore, it is more necessary to ensure sound quality with the original waveform of the receiving signal than holding the level of the receiving signal to remove the pulse noise. Therefore, the level hold enable unit 170 disables the function of the level hold unit 150 to supply the detection signal D to the decoder 17 without holding the level.

<<Detailed Configuration of Noise Canceller>>

==Level Hold Unit==

Figure 3:
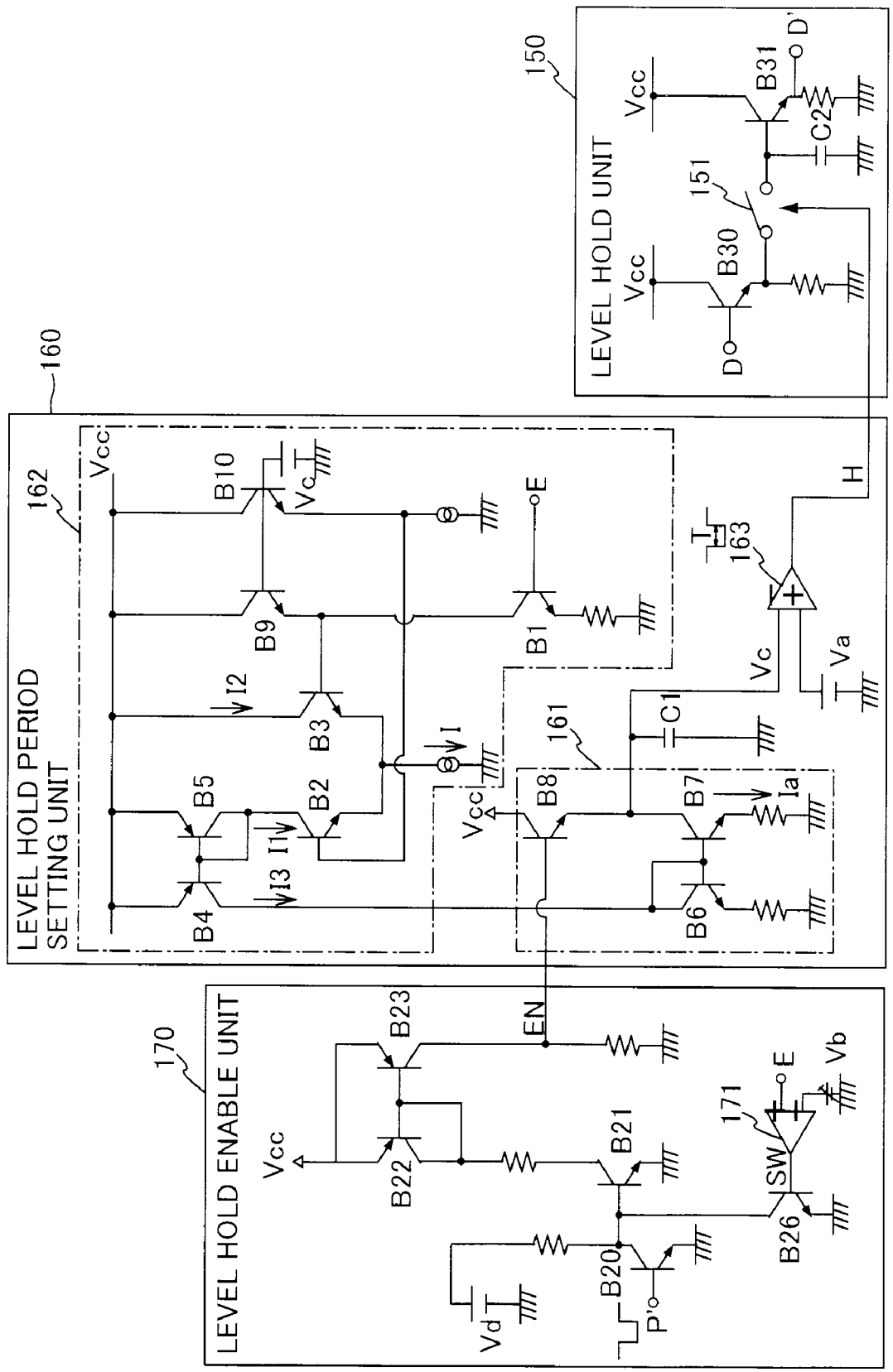
FIG. 3 is a diagram of a configuration of the noise canceller according to an embodiment of the present invention.
Figure 4A:
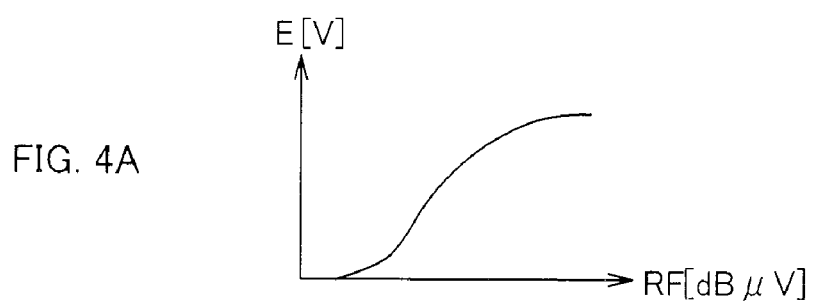
FIG. 4A, FIG. 4B, FIG. 4C, and FIG. 4D are main signal waveform diagrams for explaining operation of a level hold period setting unit according to an embodiment of the present invention.
Figure 4B:
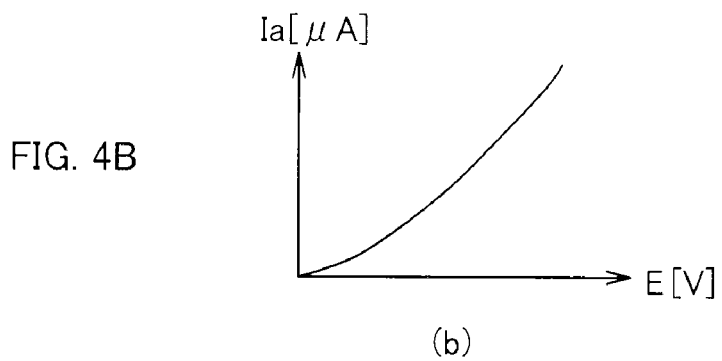
Figure 4C:
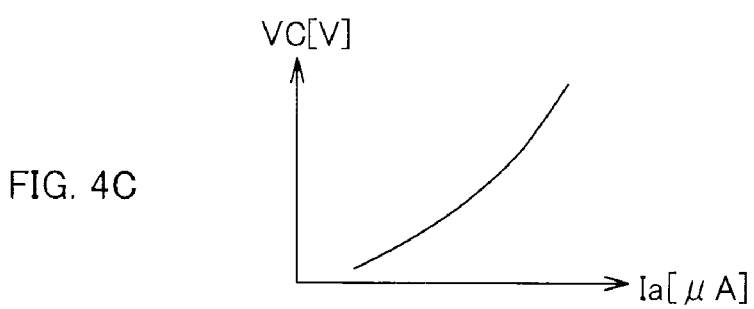
Figure 4D:
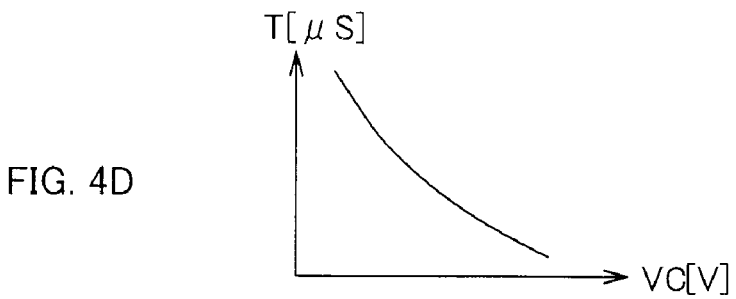
Figure 5:
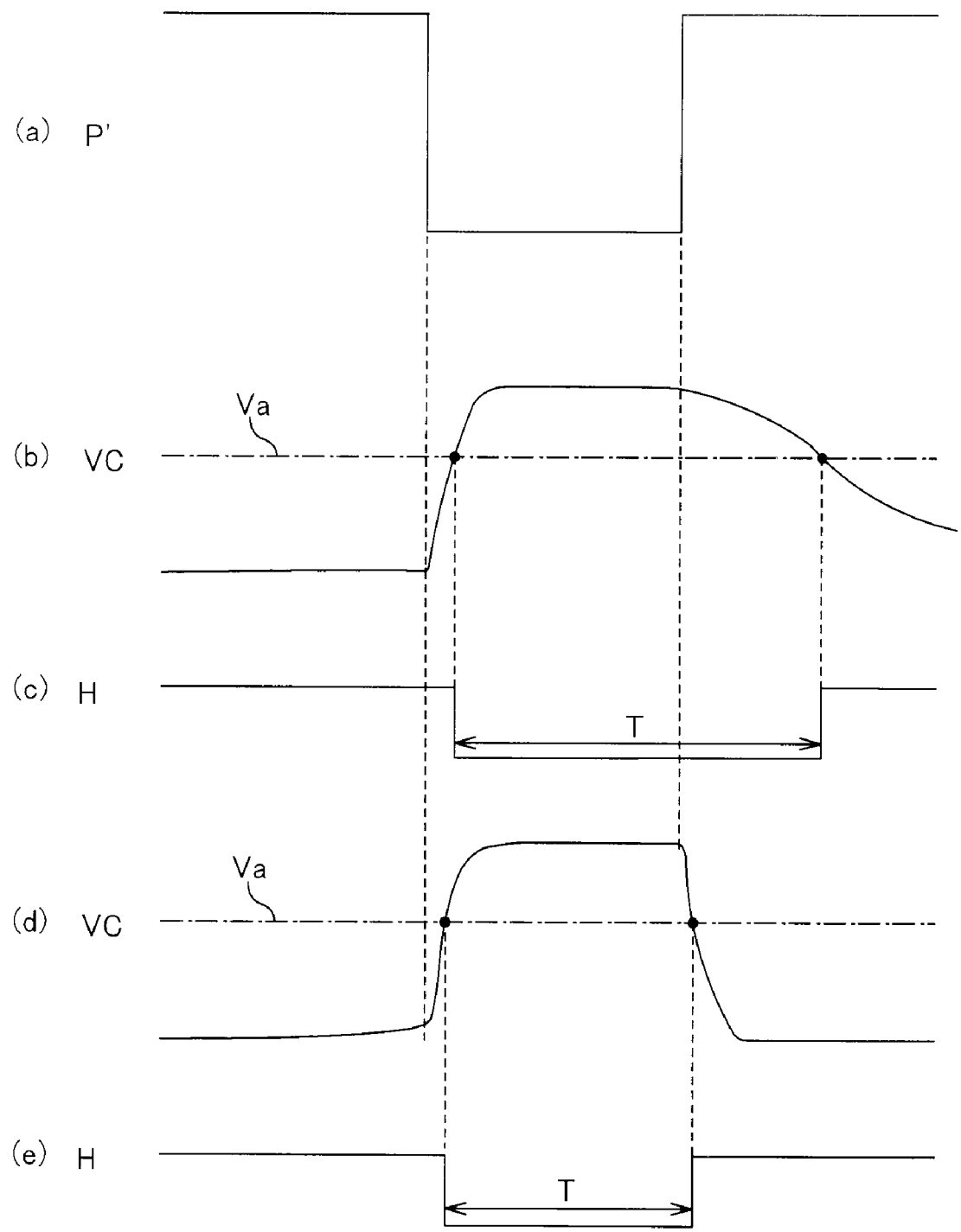
FIG. 5 is a main signal waveform diagram for explaining operation of the level hold period setting unit according to an embodiment of the present invention.

The configuration/operation of the level hold unit 150 according to an embodiment of the present invention will be described with reference to FIG. 3. FIG. 3 is a diagram of the configuration of the noise canceller 100 according to the present invention.

The level hold unit 150 is mainly configured by a switch 151 allowing the passage of the detection signal D if the pulse noise P is not detected and blocking the passage of the detection signal D if the pulse noise P is detected, and a capacitance element C2 electrically charged by the detection signal D passed through the switch 151.

The switch 151 is disposed between an emitter electrode of an emitter-grounded NPN transistor B30 that the detection signal D is input to through a base electrode and a base electrode of an emitter-grounded NPN transistor B31 that outputs the detection signal D' from an emitter electrode, and is opened/closed based on the period setting signal H supplied from a comparator 163. It is assumed that the switch 151 is closed when the period setting signal H is at the H-level and is opened when the period setting signal H is at the L-level indicating the level hold period T.

When the switch 151 is constantly closed based on the H-level period setting signal H, a current flowing through the NPN transistor B30 is determined in accordance with the level of the detection signal D; the capacitance element C2 is charged through the switch 151; and a current flowing through the NPN transistor B31 is determined. As a result, the detection signal D' output from the emitter side of the NPN transistor B31 has a waveform corresponding to the level of the detection signal D input to the base electrode of the NPN transistor B30.

On the other hand, when the switch 151 is opened based on the L-level period setting signal H, a current flowing through the NPN transistor B31 is fixed during the L-level period of the period setting signal H in accordance with a voltage charged in the capacitance element C2 immediately before the switch 151 is opened. That is, during the L-level period of the period setting signal H, the detection signal D' is retained at the level of the detection signal D immediately before the switch 151 is opened.

==Level Hold Period Setting Unit==

The configuration/operation of the level hold period setting unit 160 according to the present invention will be described with reference to FIGS. 3 to 6A, FIG. 6B, and FIG. 6C.

FIG. 4A, FIG. 4B, FIG. 4C, FIG. 4D and FIG. 5 are main signal waveform diagrams for explaining the operation of the level hold period setting unit 160 according to the present invention. FIGS. 5(b) and (c) are a charge voltage VC and a waveform of the period setting signal H in accordance with the pulse noise P' shown in FIG. 5(a) when the reception level is high level. FIGS. 5(d) and (e) are a charge voltage VC and a waveform of the period setting signal H in accordance with the pulse noise P' shown in FIG. 5(a) when the reception level is low level.

Figure 6A:
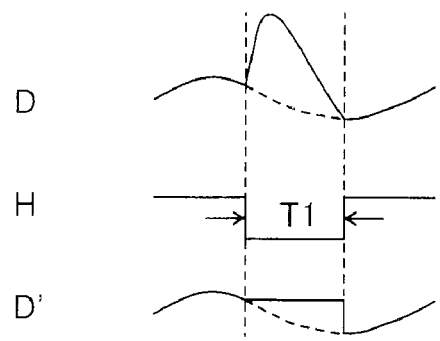
FIG. 6A, FIG. 6B, and FIG. 6C are diagrams of a relationships between reception levels and level hold periods according to an embodiment of the present invention.
Figure 6B:
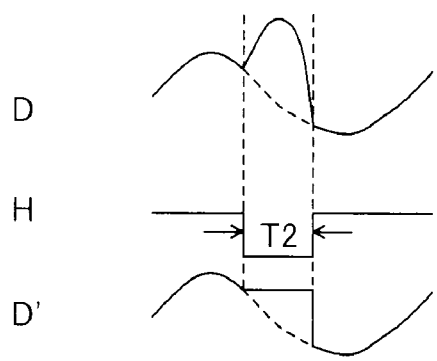
Figure 6C:
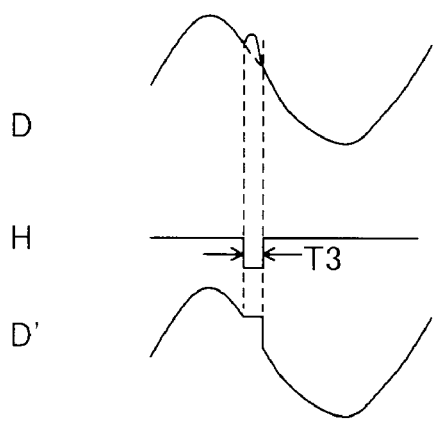

FIG. 6A, FIG. 6B, and FIG. 6C are diagrams of a relationships between reception levels and the level hold periods T. FIG. 6A shows waveforms of the detection signals D, D', and the period setting signal H before and after holding the level when the reception level is low level; FIG. 6B shows waveforms of the detection signals D, D', and the period setting signal H before and after holding the level when the reception level is intermediate level; and FIG. 6C shows waveforms of the detection signals D, D', and the period setting signal H before and after holding the level when the reception level is high level.

The level hold period setting unit 160 is mainly configured by a capacitance element C1, a charge controlling unit 161 that performs control to electrically charge the capacitance element C1 if the pulse noise P is not detected and to allow the capacitance element C1 to discharge electricity when the pulse noise P is detected, a charge time controlling unit 162 that controls time of charging to the capacitance element C1 in accordance with the electric field intensity E detected by the S-meter 20, and a comparator 163 that compares the charge voltage VC of the capacitance element C1 and a reference voltage Va to output the rectangular-wave period setting signal H for setting the level hold period T (period of L-level).

The charge controlling unit 161 is mainly configured by a serially connected body of NPN transistors B8 and B7 disposed between a power source voltage VCC and a ground voltage VSS. The connection portion of the NPN transistors B8 and B7 is connected to the capacitance element C1 to be charged. The NPN transistor B7 is commonly connected to a diode-connected NPN transistor B6 at the base electrodes to configure a so-called current mirror circuit.

Although details will be described later, an enable signal EN supplied from the level hold enable unit 170 to the base electrode of the NPN transistor B8 has a waveform acquired by inverting the pulse noise P' output from the comparator 140. Therefore, the enable signal EN is L-level if the pulse noise P' is H-level and the enable signal EN is H-level if the pulse noise P' is L-level.

Therefore, if the enable signal EN is H-level, the NPN transistor B8 functions in a conductive direction, and a charge path is formed from the power source voltage VCC through the NPN transistor B8 to the capacitance element C1. That is, in this case, the capacitance element C1 is charged based on the power source voltage VCC. On the other hand, if the enable signal EN is L-level, the NPN transistor B8 functions in a nonconductive direction, and since the emitter voltage of the NPN transistor B8 is reduced, the charge voltage VC of the capacitance element C1 is also reduced in accordance with the reduction of the emitter voltage.

In the characteristics of the charge voltage VC of the capacitance element C1, the charge voltage VC becomes high level if the enable signal EN is H-level and becomes low level if the enable signal EN is L-level (see FIGS. 5(a), (b), and (d)). This charge voltage VC is applied to an inverting input terminal of the comparator 163.

On the other hand, to a non-inverting input terminal of the comparator 163, the reference voltage Va is applied which is set near the intermediate level of the charge voltage VC.

As a result, the comparator 163 outputs H-level if the charge voltage VC is lower level than the reference voltage Va and outputs L-level if the charge voltage VC is higher level than the reference voltage Va (see FIG. 5(b) to (e)). It is assumed that the period of outputting L-level from the comparator 163 corresponds to the level hold period T when the switch 151 is opened.

The charge time controlling unit 162 is disposed with a differential transistor pair (B2, B3) having commonly connected emitter electrodes and connected to a constant current source I. An emitter current of an NPN transistor B10 having a base electrode applied with the reference voltage Vc is supplied to a base electrode of one NPN transistor B2 of the differential transistor pair (B2, B3), and an emitter current of an NPN transistor B9 having a base electrode applied with the reference voltage Vc is supplied to a base electrode of the other NPN transistor B3. It is assumed that the emitter currents of the NPN transistors B9 and B10 are balanced in the normal condition and therefore that currents I1 and I2 flowing through the NPN transistors B2 and B3 configuring the differential transistor pair (B2, B3) are also balanced.

By the way, the NPN transistor B9 is disposed between the power source voltage VCC and the ground voltage VSS and is serially connected to an NPN transistor B1 having a base electrode applied with the electric field intensity E detected by the S-meter 20. The electric field intensity E detected by the S-meter 20 is a direct-current voltage acquired by smoothing the RF signal received by the receiving antenna 10 and has a waveform following the level of the RF signal (see FIG. 4A).

That is, as the electric field intensity E detected by the S-meter 20 is increased, the emitter current of the NPN transistor B9 flows more through the collector electrode of the NPN transistor B1 than the base electrode of the NPN transistor B3. As a result, the balance is disrupted in the currents I1 and I2 flowing through the NPN transistors B2 and B3 configuring the differential transistor pair (B2, B3), and the current I1 flows more than the current I2.

The collector electrode of the NPN transistor B2 is connected to a collector electrode of a PNP transistor B5 configuring a current mirror circuit in combination with a PNP transistor B4. The collector electrode of the PNP transistor B4 is connected to the collector electrode of the NPN transistor B6 configuring a current mirror circuit in combination with the NPN transistor B7. The collector electrode of the NPN transistor B7 is connected to the emitter electrode of the NPN transistor B8 and the capacitance element C1 as described above.

As the electric field intensity E detected by the S-meter 20 is increased, the balance is disrupted in the currents I1 and I2 flowing through the NPN transistors B2 and B3 and the current I1 flows more than the current I2 as described above. In this case, the current I3 flowing through the NPN transistors B4, B6 and the current Ia flowing through the NPN transistors B8, B7 are increased (see FIG. 4B). Since the charge capacity of the capacitance element C1 is increased correspondingly to the increase of the current Ia, the charge voltage VC of the capacitance element C1 is increased (see FIG. 4C). Therefore, this reduces the period when the period setting signal H output from the comparator 163 is L-level, i.e., the level hold period T for opening the switch 151 (see FIG. 4D).

If the electric field intensity E detected by the S-meter 20 is high, the level hold period setting unit 160 shortens the level hold period T for opening the switch 151 (see FIGS. 5(d) and (e)), and if the electric field intensity E detected by the S-meter 20 is low, the level hold period setting unit 160 extends the level hold period T for opening the switch 151 (see FIGS. 5(b) and (c)).

Therefore, as shown separately according to level of the receiving signal, in FIG. 6A (level of the receiving signal is low level), FIG. 6B (level of the receiving signal is intermediate level), and FIG. 6C (level of the receiving signal is high level), the period when the period setting signal H is L-level, i.e., the length of the level hold period T is appropriately adjusted in accordance with the level of the receiving signal received by the receiving antenna 10 (e.g., electric field intensity), and the pulse noise P can appropriately be removed which may be superimposed on the receiving signal.

==Level Hold Enable Unit==

Figure 7:
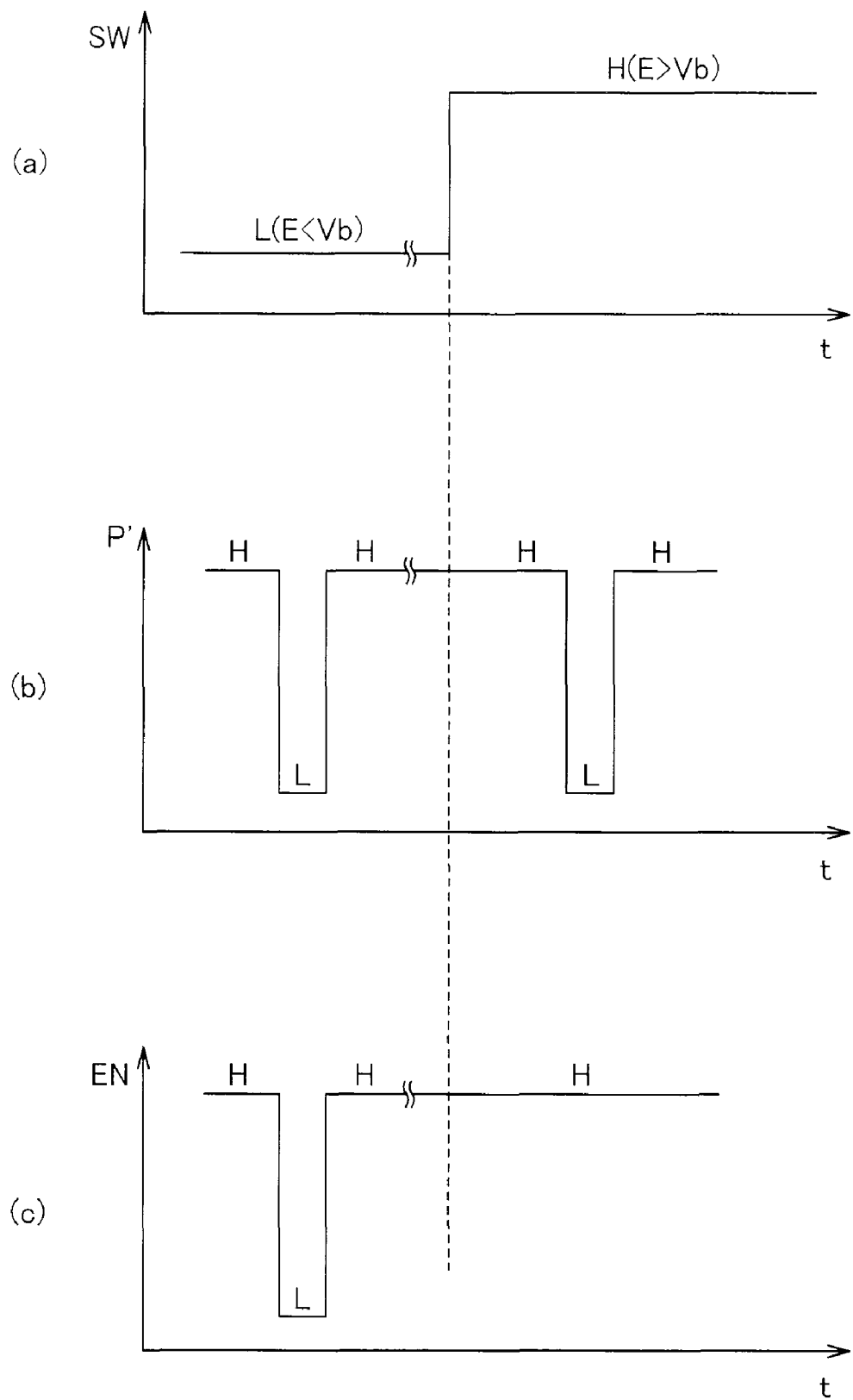
FIG. 7 is a main signal waveform diagram for explaining operation of a level hold enable unit according to an embodiment of the present invention.
Figure 8:
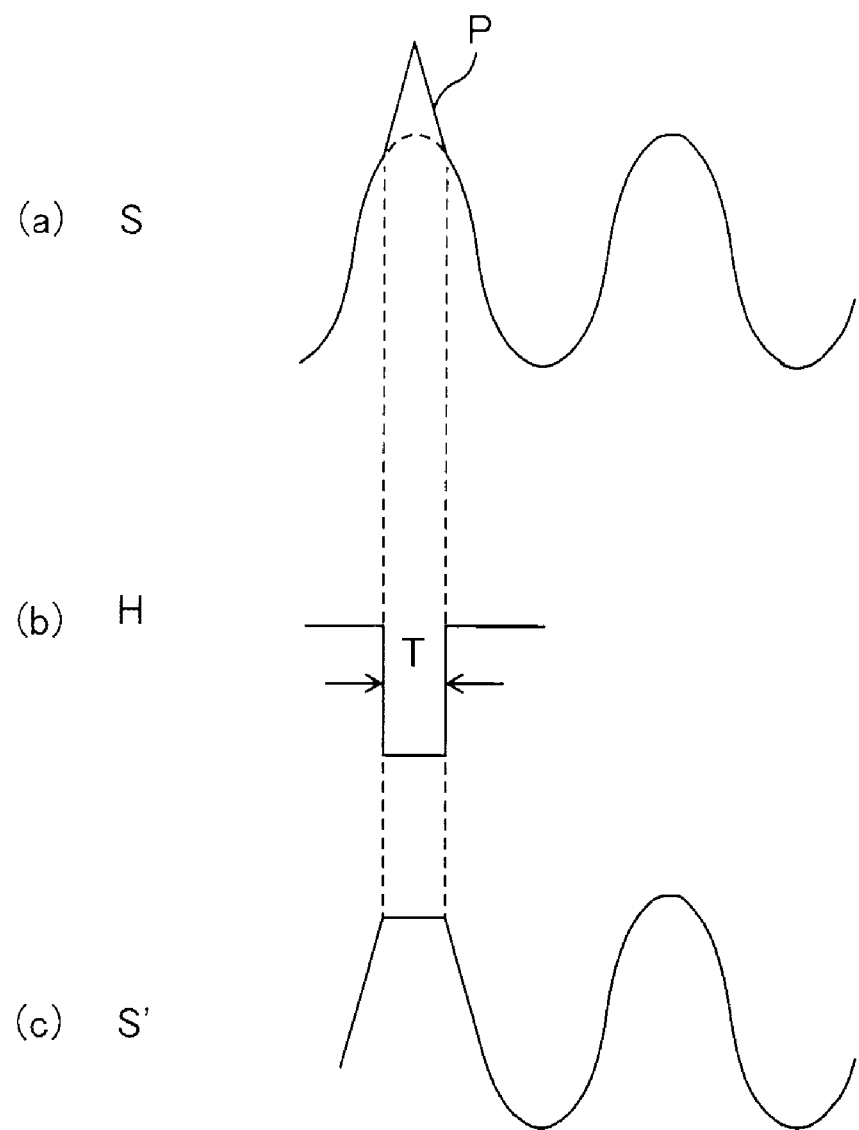
FIG. 8 is a main signal waveform diagram for explaining operation of a noise canceller.

The configuration/operation of the level hold enable unit 170 according to the present invention will be described with reference to FIG. 3 and FIG. 7. FIG. 7 is a main signal waveform diagram for explaining the operation of the level hold enable unit 170 according to the present invention.

If it is indicated that the electric field intensity E detected by the S-meter 20 does not exceed the reference level Vb, the level hold enable unit 170 enables control based on whether the charge controlling unit 161 detects the pulse noise P, and if it is indicated that the electric field intensity E detected by the S-meter 20 exceeds the reference level Vb, the level hold enable unit 170 disables control based on whether the charge controlling unit 161 detects the pulse noise P.

The case of enabling control based on the detection of the pulse noise P is the case that the charge controlling unit 161 normally performs control of changing the level of the charge voltage VC based on the enable signal EN. On the other hand, the case of disabling control based on the detection of the pulse noise P is the case that the charge controlling unit 161 disables control of changing the level of the charge voltage VC based on the enable signal EN. Specifically, the level of the enable signal EN supplied to the base electrode of the NPN transistor B8 is fixed to L-level regardless of the level of the pulse noise P'. As a result, the charge voltage VC is fixed in the comparator 163 such that the level of the charge voltage VC is always lower than the reference voltage Va, and the level of the period setting signal H is fixed to H-level.

Describing in detail, the level hold enable unit 170 includes an NPN transistor B20 supplied with the pulse noise P' through the base electrode, an NPN transistor B21 connected in multistage to the NPN transistor B20, a diode-connected PNP transistor B22 serially connected to the NPN transistor B21, and a PNP transistor B23 configuring a current mirror circuit in combination with the PNP transistor B22. The enable signal EN is output from the collector electrode of the PNP transistor B23.

If the pulse noise P' is H-level, since the NPN transistor B20 functions in the conductive direction and the base potential of the NPN transistor B21 is pulled toward the ground voltage VSS through the collector-emitter path of the NPN transistor B20 from the reference voltage Vd, the NPN transistor B21 functions in the nonconductive direction. Since the PNP transistors B22 and B23 configuring the current mirror circuit function in the nonconductive direction in this situation, the level of the enable signal EN output from the collector electrode of the PNP transistor B23 becomes the ground potential VSS (this state is defined as L-level).

On the other hand, if the pulse noise P' is L-level, since the NPN transistor B21 functions in the nonconductive direction and the reference voltage Vd is applied to the base electrode of the NPN transistor B21, the NPN transistor B21 functions in the conductive direction. Since the PNP transistors B22 and B23 configuring the current mirror circuit function in the conductive direction in this situation, the level of the enable signal EN output from the collector electrode of the PNP transistor B23 becomes a voltage obtained by dividing the power source voltage VCC by on-resistance of the PNP transistor B23 (this state is defined as H-level).

In this way, the enable signal EN output from the collector electrode of the PNP transistor B23 becomes a waveform acquired by inverting the pulse noise P' supplied to the base electrode of the NPN transistor B20.

By the way, an emitter-grounded NPN transistor B26 is connected between the NPN transistors B20 and B21 connected in multistage. The base electrode of the NPN transistor B26 is supplied with a switch signal SW output from the comparator 171. To the comparator 171, the electric field intensity E detected by the S-meter 20 is applied through the non-inverting input terminal and the reference voltage Vb is applied through the inverting input terminal.

Since the electric field intensity E is set so as not to exceed the reference voltage Vb in the normal state, the switch signal SW output from the comparator 171 shows L-level (see FIG. 7(a)), and the NPN transistor B26 becomes the non-conductive state. Therefore, the enable signal EN is output in accordance with the level of the pulse noise P without the effect of the NPN transistor B26 (see FIGS. 7(b) and (c)).

On the other hand, if the electric field intensity E exceeds the reference voltage Vb, the switch signal SW output from the comparator 171 shows H-level (see FIG. 7(*a*)), and the NPN transistor B26 becomes the conductive state. In this case, the base potential of the NPN transistor B21 is pulled toward the ground voltage VSS through the collector-emitter path of the NPN transistor B26.

Therefore, the enable signal EN is output in accordance with the level of the pulse noise P without the effect of the NPN transistor B26. Therefore, since the NPN transistor B21 functions in the direction toward the non-conductive state regardless of whether the pulse noise P' is H-level or L-level in this case, the enable signal EN is fixed to L-level (see FIGS. 7(*b*) and (*c*)). As a result, the charge voltage VC is fixed to L-level, and since the reference voltage Va maintains higher level than the charge voltage VC, the comparator 163 continuously outputs the H-level period setting signal H.

The above embodiments of the present invention are simply for facilitating the understanding of the present invention and are not in any way to be construed as limiting the present invention. The present invention may variously be changed or altered without departing from its spirit and encompass equivalents thereof.

It is claimed:

1. A noise canceller that inputs a receiving signal and removes pulse noise superimposed on the receiving signal, the noise canceller comprising:
   a pulse noise detecting unit that detects the pulse noise superimposed on the receiving signal;
   an electric field intensity detecting unit that detects an electric field intensity of the receiving signal;
   a level hold unit that, in the absence of pulse noise, outputs the receiving signal and, when triggered by the detection of the pulse noise by the pulse noise detecting unit, holds a level of the receiving signal for a level hold period; and
   a level hold period setting unit that sets the level hold period in accordance with the electric field intensity of the receiving signal, the level hold period decreasing as the electric field intensity of the receiving signal becomes higher and increasing as the electric field intensity of the receiving signal becomes lower.

2. The noise canceller of claim 1, further comprising:
   a level hold enable unit that exercises control to enable the holding of the level in the level hold unit if the electric field intensity of the receiving signal does not exceed a reference level, and to disable the holding of the level in the electric field intensity exceeds the reference level.

3. The noise canceller of claim 1, wherein
   the electric field intensity detecting unit is an S-meter.

4. The noise canceller of claim 1, wherein
   the level hold period setting unit includes
   a capacitance element,
   a charge controlling unit that exercises control to charge the capacitance element if the pulse noise is not detected, and to discharge the capacitance element if the pulse noise is detected,
   a charge time controlling unit that controls time of charging to the capacitance element in accordance with the electric field intensity of the receiving signal, and
   a comparator that compares the charge voltage of the capacitance element and a reference voltage to output the rectangular waveform period setting signal for setting the level hold period.

5. The noise canceller of claim 4, wherein
   the level hold unit includes
   a switch allowing a passage of the receiving signal if the pulse noise is not detected, and blocking the passage of the receiving signal if the pulse noise is detected, and
   a capacitance element that is charged by the receiving signal allowed to pass through the switch.

6. The noise canceller of claim 4, wherein
   the level hold enable unit enables the control of the time of charging in the charge time controlling unit if the electric field intensity of the receiving signal does not exceed the reference level, and disables the control of the time of charging in the charge time controlling unit if the electric field intensity of the receiving signal exceeds the reference level.

7. An AM receiving apparatus that frequency-converts an AM modulation signal received by a receiving antenna into an intermediate frequency signal and performs AM detection of the intermediate frequency signal to output a detection signal, the apparatus comprising:
   a pulse noise detecting unit that detects the pulse noise superimposed on the intermediate frequency signal;
   an electric field intensity detecting unit that detects an electric field intensity of the intermediate frequency signal;
   a level hold unit that, in the absence of pulse noise on the intermediate frequency signal, outputs the detection signal and, when triggered by the detection of the pulse noise by the pulse noise detecting unit, holds a level of the detection signal for a level hold period; and
   a level hold period setting unit that sets the level hold period in accordance with the electric field intensity of the intermediate frequency signal, the level hold period decreasing as the electric field intensity of the intermediate frequency signal becomes higher and increasing as the electric field intensity of the intermediate frequency signal becomes lower.

* * * * *